(12) United States Patent
Modi et al.

(10) Patent No.: US 11,705,787 B2
(45) Date of Patent: Jul. 18, 2023

(54) MOTOR CONNECTOR WITH INTEGRATED MOTOR CONTROL FUNCTIONALITY

(71) Applicant: Nidec Motor Corporation, St. Louis, MO (US)

(72) Inventors: Chetan O. Modi, Valley Park, MO (US); Steven R. Palmer, Highland, IL (US); Daniel E. Bailey, Ballwin, MO (US); Jared Joseph Lesicko, St. Louis, MO (US)

(73) Assignee: Nidec Motor Corporation, St. Louis, MO (US)

( * ) Notice: Subject to any disclaimer, the term of this patent is extended or adjusted under 35 U.S.C. 154(b) by 741 days.

(21) Appl. No.: 16/684,777

(22) Filed: Nov. 15, 2019

(65) Prior Publication Data

US 2021/0152058 A1    May 20, 2021

(51) Int. Cl.
| | |
|---|---|
| *H02K 11/33* | (2016.01) |
| *H05K 5/00* | (2006.01) |
| *H05K 1/14* | (2006.01) |
| *H05K 1/18* | (2006.01) |
| *H02K 5/22* | (2006.01) |
| *H02K 11/28* | (2016.01) |

(52) U.S. Cl.
CPC ............ *H02K 11/33* (2016.01); *H02K 5/225* (2013.01); *H02K 11/28* (2016.01); *H05K 1/144* (2013.01); *H05K 1/18* (2013.01); *H05K 5/0069* (2013.01); *H02K 2211/03* (2013.01); *H02K 2213/12* (2013.01); *H05K 2201/10053* (2013.01); *H05K 2201/10151* (2013.01); *H05K 2201/10189* (2013.01)

(58) Field of Classification Search
CPC ...... H02K 11/0089; H02K 5/225; H02K 5/22; H02K 11/0068; H02K 11/28; H02K 11/33; H05K 1/144; H05K 1/18; H05K 5/0069

See application file for complete search history.

(56) References Cited

U.S. PATENT DOCUMENTS

| | | |
|---|---|---|
| 8,632,353 B2 | 1/2014 | Rassoolkhani et al. |
| 8,764,472 B2 | 7/2014 | Rassoolkhani et al. |
| 8,837,104 B2 | 9/2014 | Geiler et al. |
| 10,090,738 B2 | 10/2018 | Schock et al. |
| 2011/0285226 A1* | 11/2011 | Fujita ............... H01L 23/49575 318/400.27 |

(Continued)

*Primary Examiner* — Ahmed Elnakib
*Assistant Examiner* — Leda T Pham
(74) *Attorney, Agent, or Firm* — Hovey Williams LLP

(57) ABSTRACT

A motor assembly includes a motor, a controller controlling at least one aspect of operation of the motor, and a control housing defining a control chamber. The controller is in part received within the control chamber. The controller includes a main electronics board and a modular connector assembly. The modular connector assembly includes a secondary electronics board and a connector at least in part supporting the secondary electronics board. The connector includes an inner connector portion and an outer connector portion. The connector extends through the control housing such that the inner connector portion is disposed inside the control chamber and the outer connector portion is disposed outside the control chamber. The outer connector portion defines a first access portal facilitating access to a first component of the secondary electronics board.

20 Claims, 14 Drawing Sheets

(56) References Cited

U.S. PATENT DOCUMENTS

| | | | |
|---|---|---|---|
| 2014/0162502 A1* | 6/2014 | Geiler | H01R 13/2421 |
| | | | 439/700 |
| 2017/0077776 A1* | 3/2017 | Urabe | H02K 3/38 |
| 2018/0119980 A1* | 5/2018 | Wasson | H02K 11/25 |
| 2018/0226861 A1* | 8/2018 | Palmer | H02K 5/06 |

* cited by examiner

MOTOR CONNECTOR WITH INTEGRATED MOTOR CONTROL FUNCTIONALITY

FIELD

The present invention relates generally to an electric motor assembly. The motor assembly includes a motor connector with integrated motor control functionality.

BACKGROUND

Those of ordinary skill in the art will appreciate that electric motors are often used in a variety of applications, including but not limited to ventilation systems. In certain applications, it may be desirable to facilitate adjustments to motor operation by a user. A user interface box is conventionally provided separate from the main control to enable a user to adjust the motor. Such a user interface box may be connected to the motor via a lead assembly. A conventional configuration such as this presents numerous disadvantages. For instance, use of a separate main control and user interface box, as well as a lead assembly for the user interface box, increases component counts and is associated with increased expenses, packaging and handling issues, additional assembly processes, and a larger motor envelope.

SUMMARY

According to one aspect of the present invention, a motor assembly includes a motor, a controller controlling at least one aspect of operation of the motor, and a control housing defining a control chamber. The controller is in part received within the control chamber. The controller includes a main electronics board and a modular connector assembly. The modular connector assembly includes a secondary electronics board and a connector at least in part supporting the secondary electronics board. The connector includes an inner connector portion and an outer connector portion. The connector extends through the control housing such that the inner connector portion is disposed inside the control chamber and the outer connector portion is disposed outside the control chamber. The outer connector portion defines a first access portal facilitating access to a first component of the secondary electronics board.

BRIEF DESCRIPTION OF THE DRAWING FIGURES

Preferred embodiments of the present invention are described in detail below with reference to the attached drawing figures, wherein.

Figure 1:
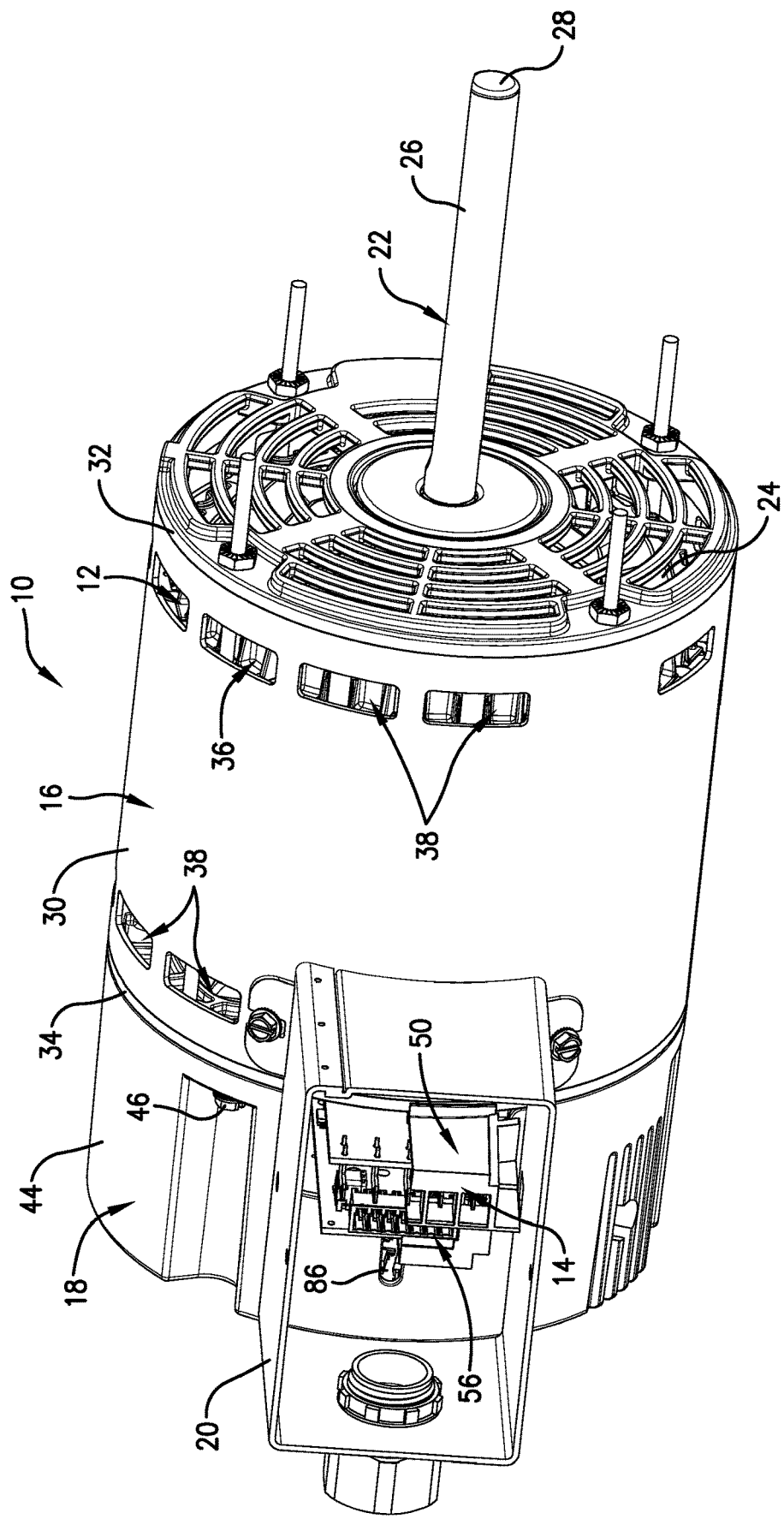
FIG. 1 is a side perspective view of a motor assembly in accordance with a preferred embodiment of the present invention, with a portion of the conduit box removed to illustrate positioning of the modular connector assembly.

The drawing figures do not limit the present invention to the specific embodiments disclosed and described herein. While the drawings do not necessarily provide exact dimensions or tolerances for the illustrated components or structures, the drawings are to scale with respect to the relationships between the components of the structures illustrated in the drawings.

DETAILED DESCRIPTION OF THE PREFERRED EMBODIMENTS

The present invention is susceptible of embodiment in many different forms. While the drawings illustrate, and the specification describes, certain preferred embodiments of the invention, it is to be understood that such disclosure is by way of example only. There is no intent to limit the principles of the present invention to the particular disclosed embodiments.

Furthermore, unless specified or made clear, the directional references made herein with regard to the present invention and/or associated components (for example, top, bottom, upper, lower, inner, outer, etc.) are used solely for the sake of convenience and should be understood only in relation to each other. For instance, a component might in practice be oriented such that faces referred to as "top" and "bottom" are sideways, angled, inverted, etc. relative to the chosen frame of reference.

Figure 2:
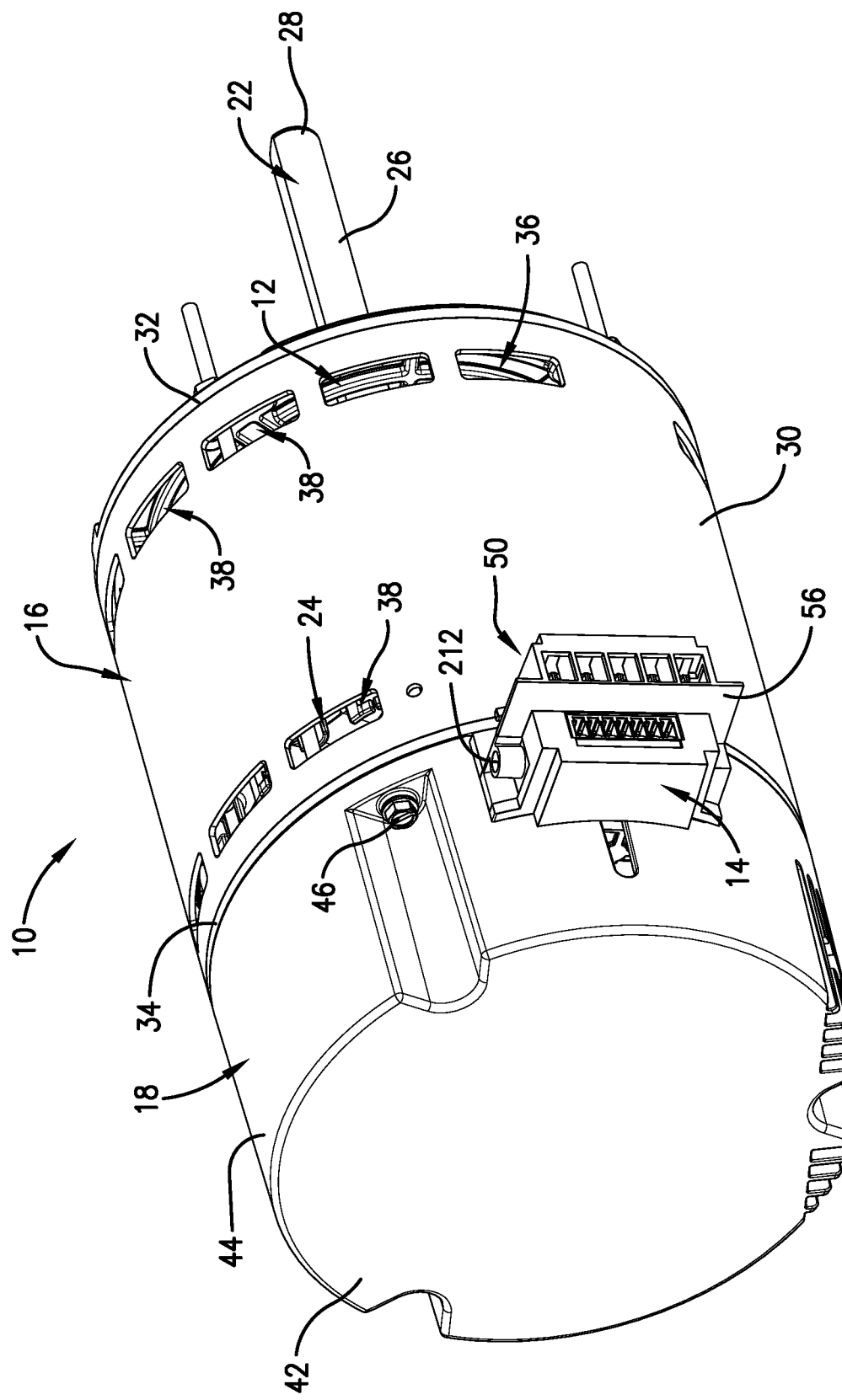
FIG. 2 is an alternative side perspective view of the motor assembly of FIG. 1, with the conduit box removed entirely.
Figure 3:
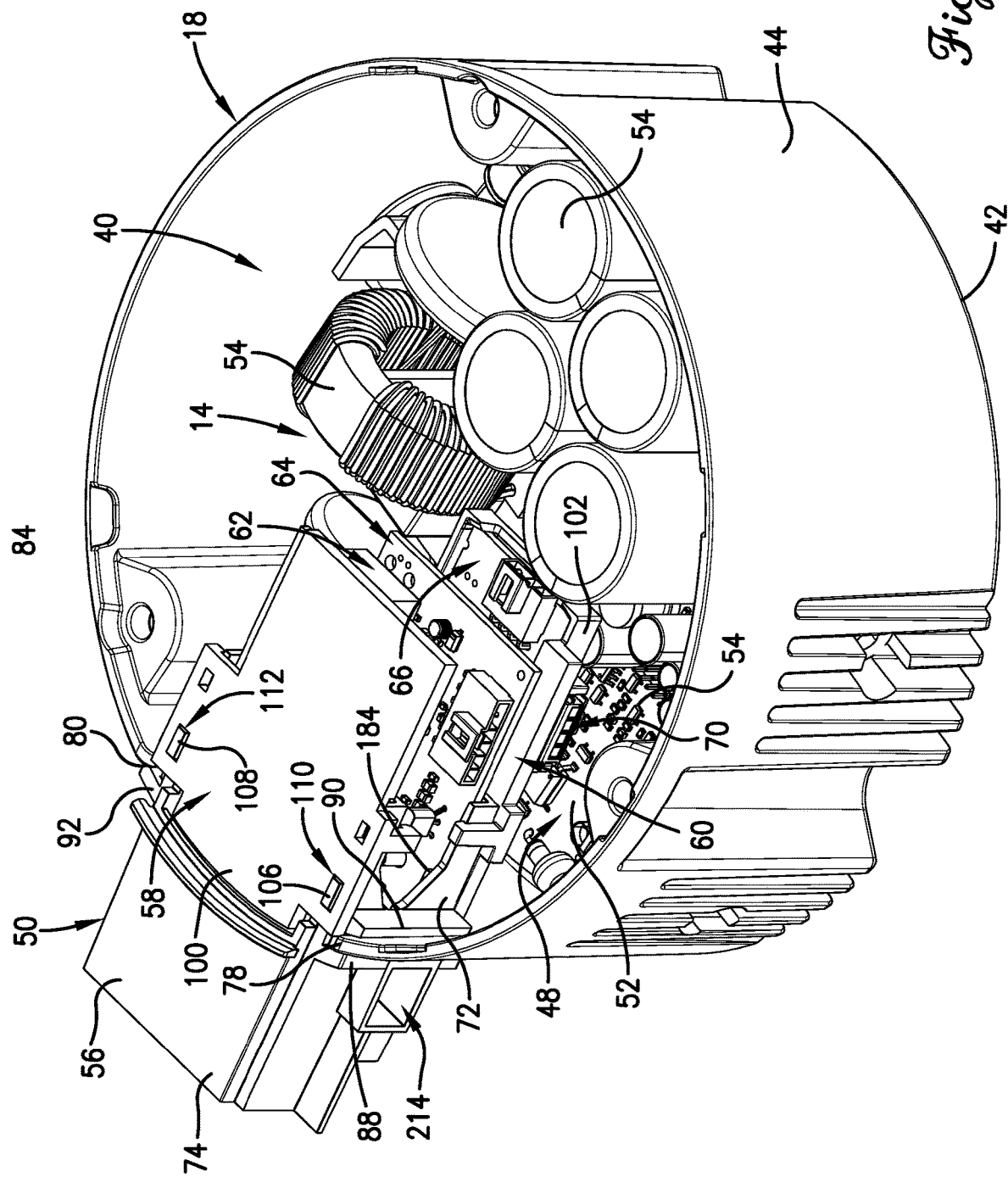
FIG. 3 is a top perspective view of the control housing and controller, including the main electronics board and the modular connector assembly, of the motor assembly of FIGS. 1 and 2.
Figure 4:
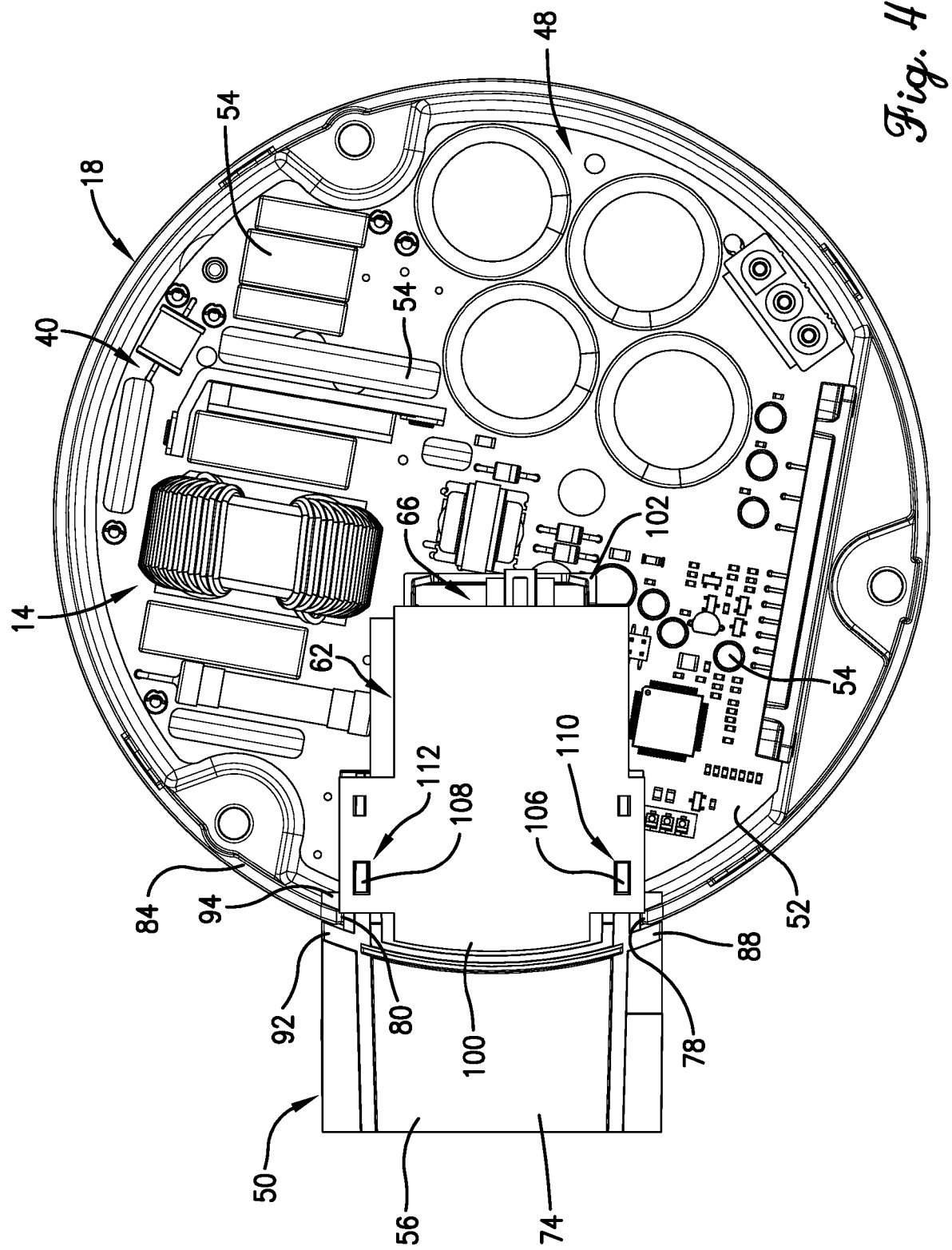
FIG. 4 is a top view of the control housing and controller of FIG. 3.
Figure 5:
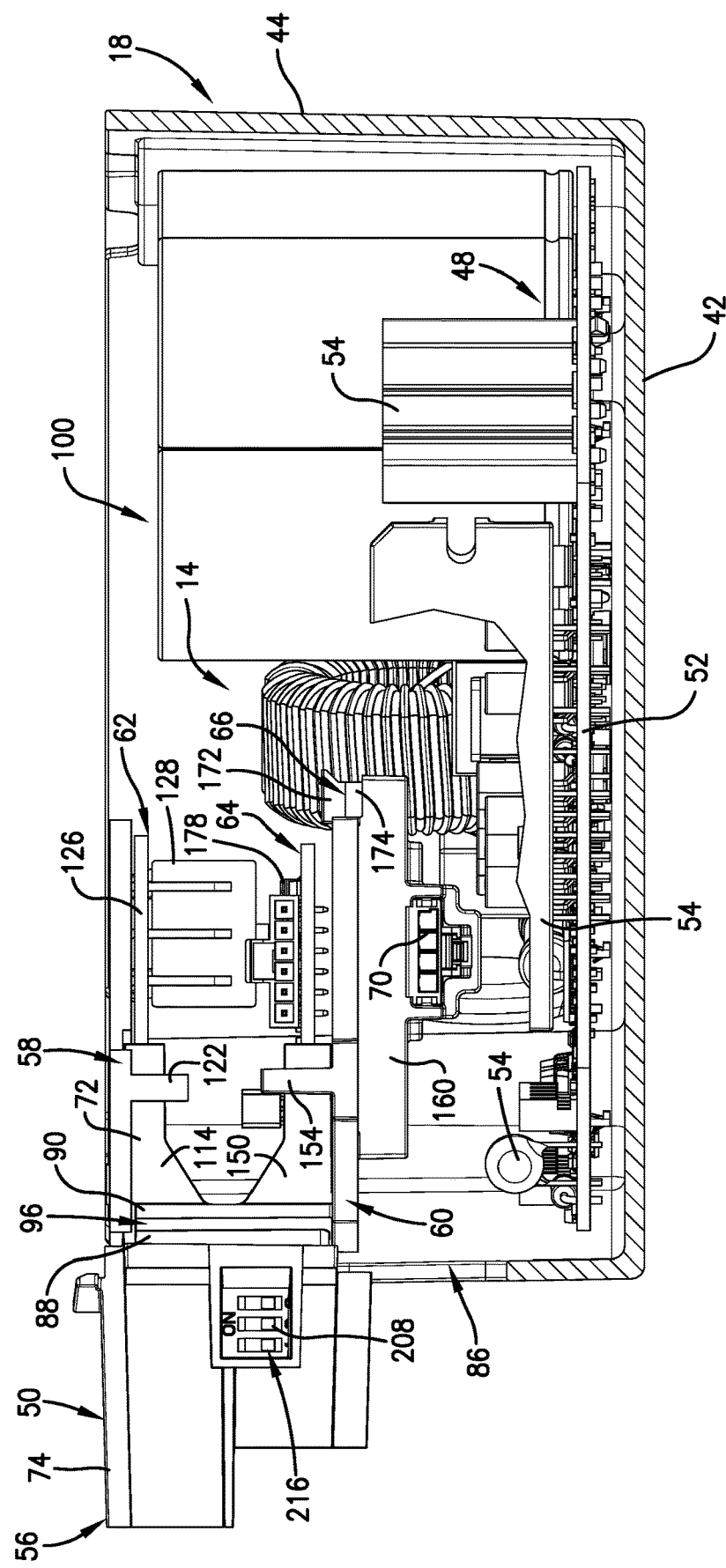
FIG. 5 is a side partially sectioned elevational view of the control housing and controller of FIGS. 3 and 4.
Figure 6:
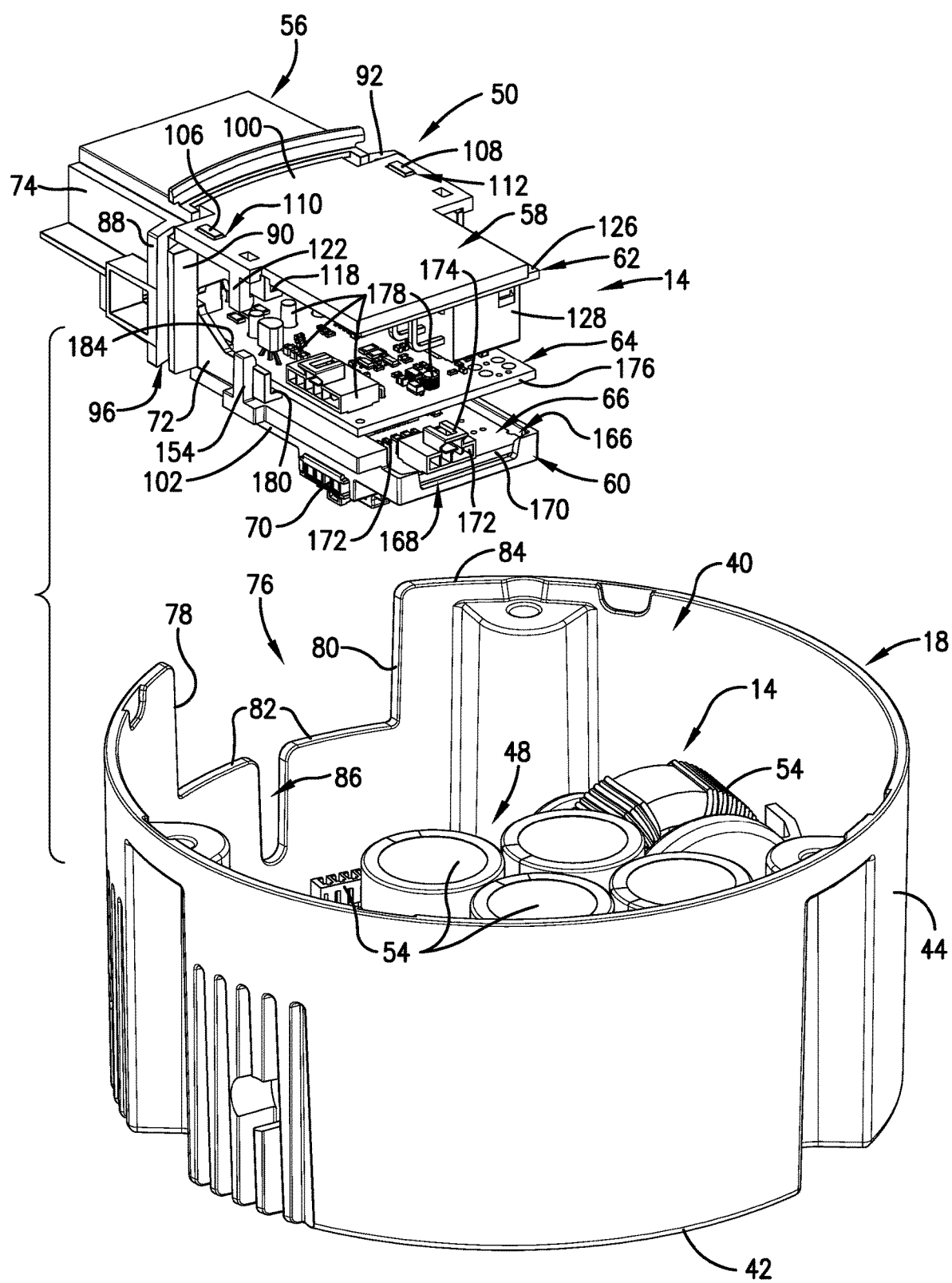
FIG. 6 is an exploded side perspective view of the control housing and controller of FIGS. 3-5.
Figure 7:
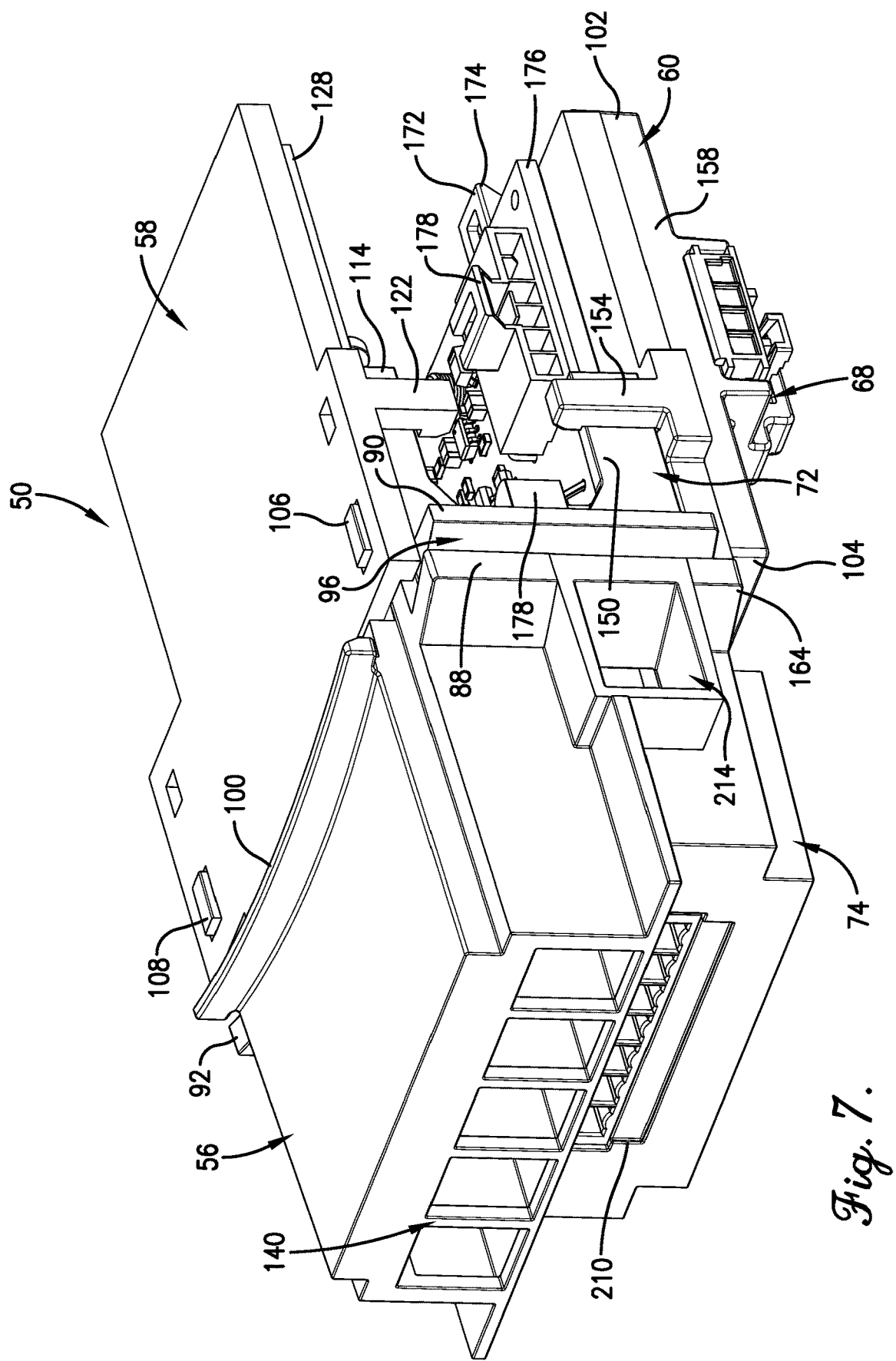
FIG. 7 is a side perspective view of the modular connector assembly of FIGS. 1-6.
Figure 8:
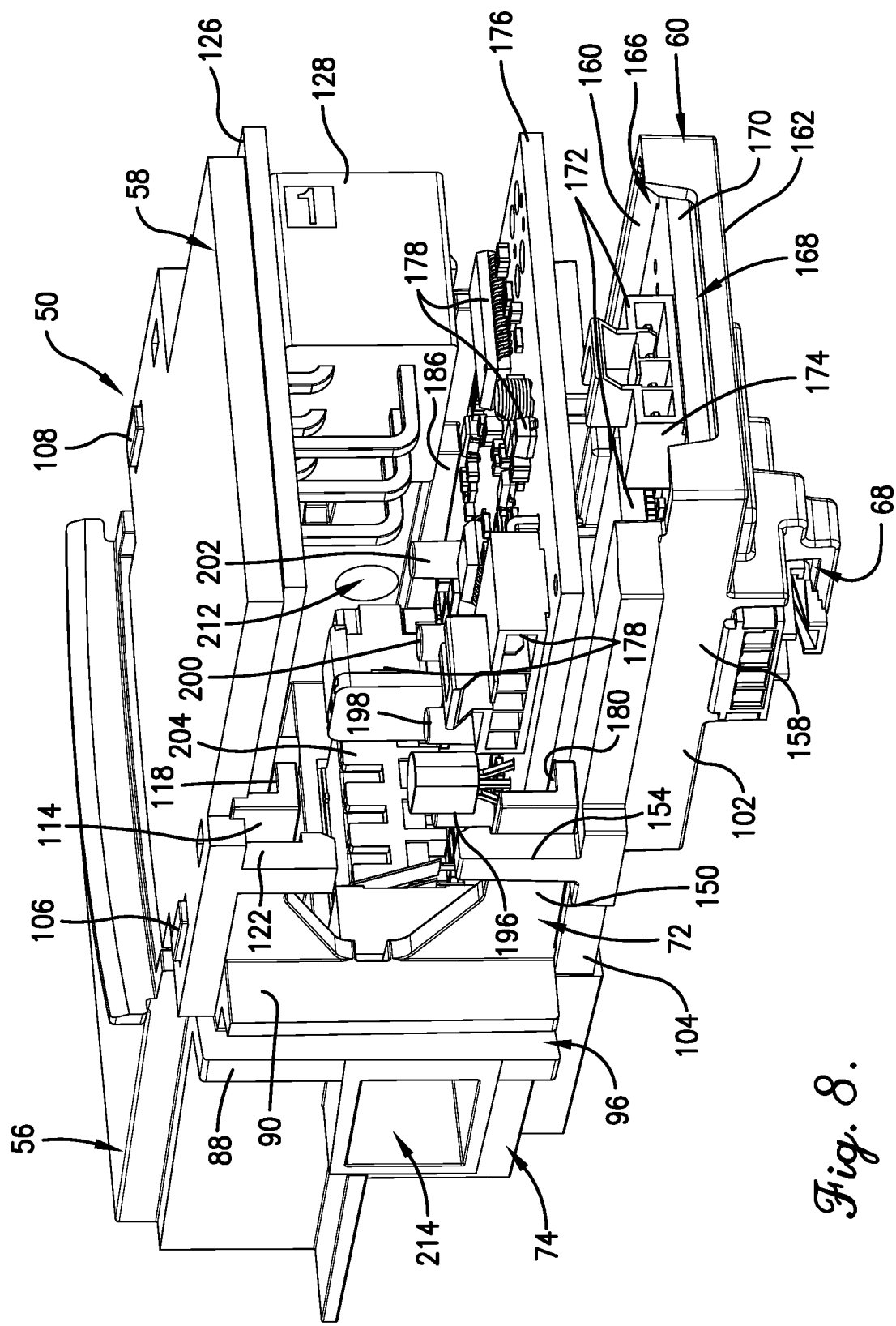
FIG. 8 is an alternative side perspective view of the modular connector assembly of FIG. 7.
Figure 9:
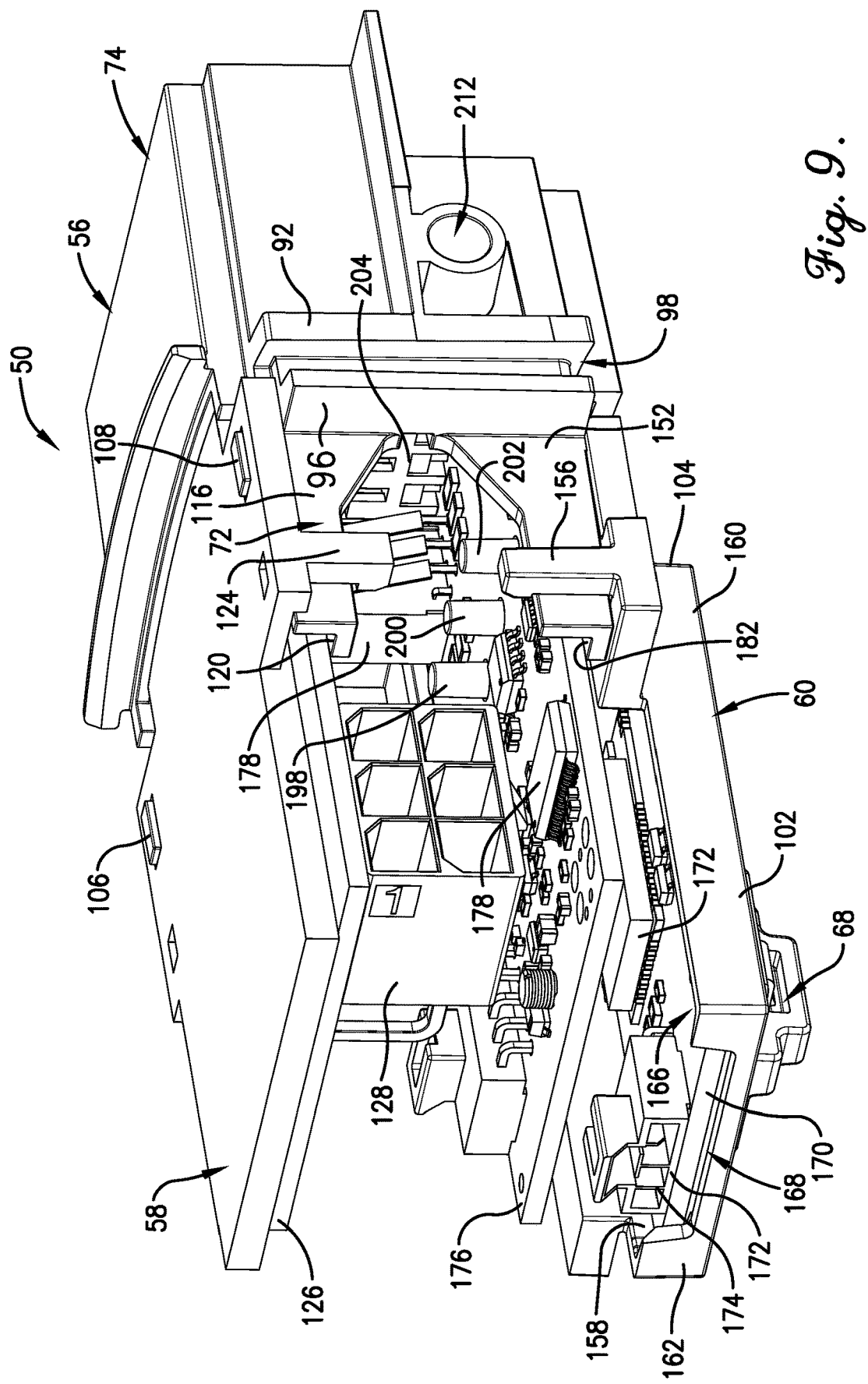
FIG. 9 is an alternative side perspective view of the modular connector assembly of FIGS. 7 and 8.
Figure 10:
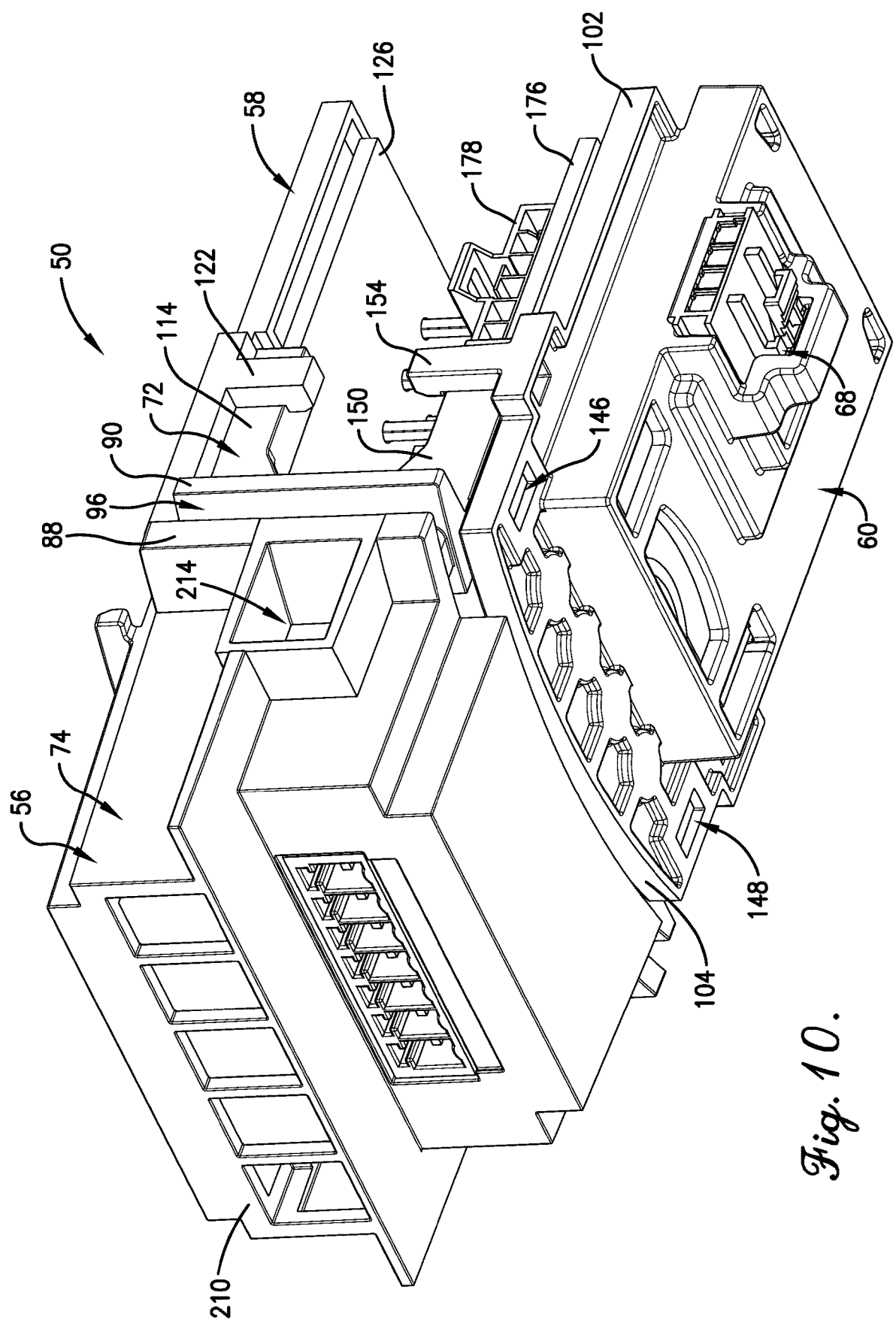
FIG. 10 is an alternative side perspective view of the modular connector assembly of FIGS. 7-9.
Figure 11:
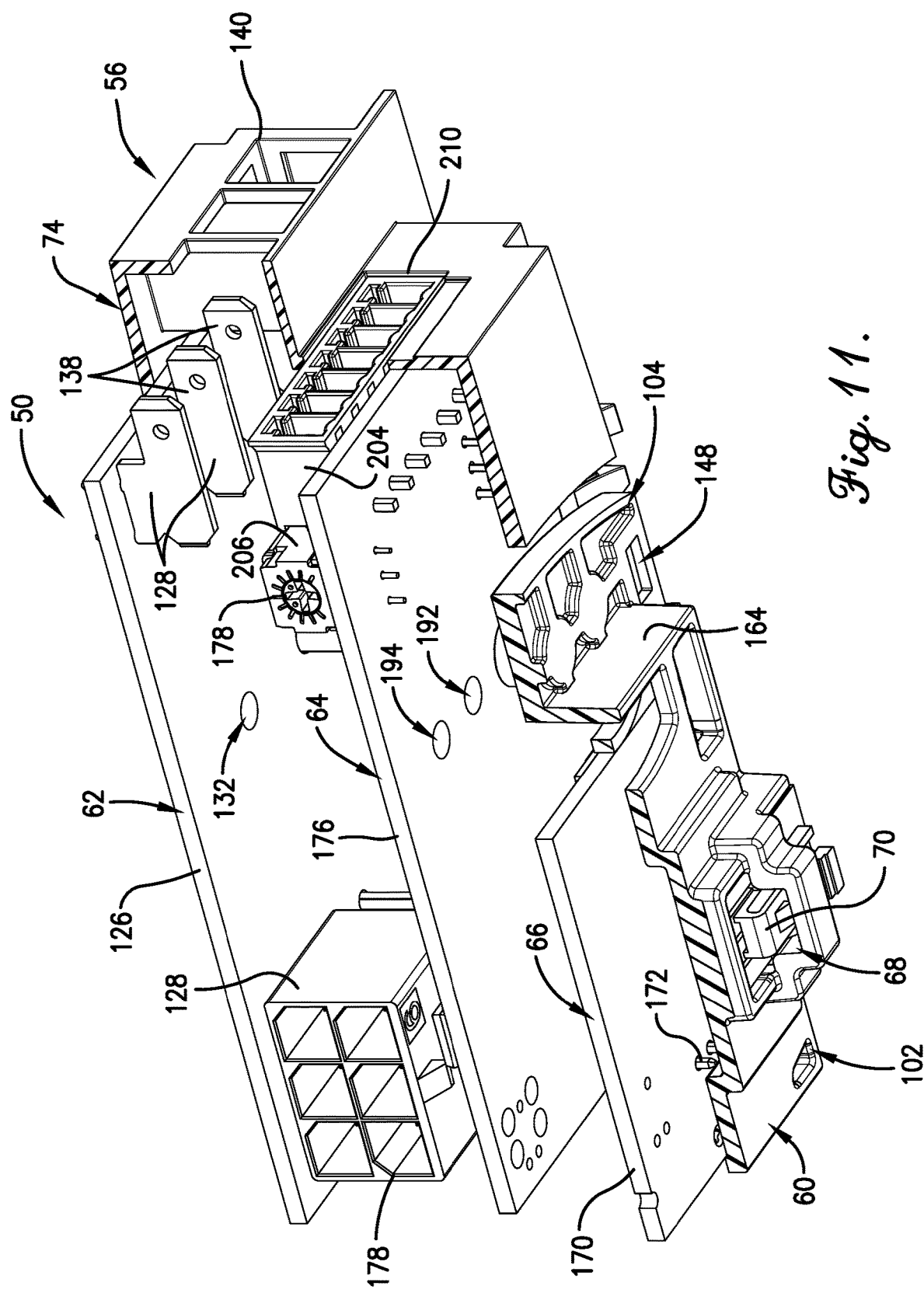
FIG. 11 is an enlarged, partially sectioned perspective view of the modular connector assembly of FIGS. 7-10.
Figure 12:
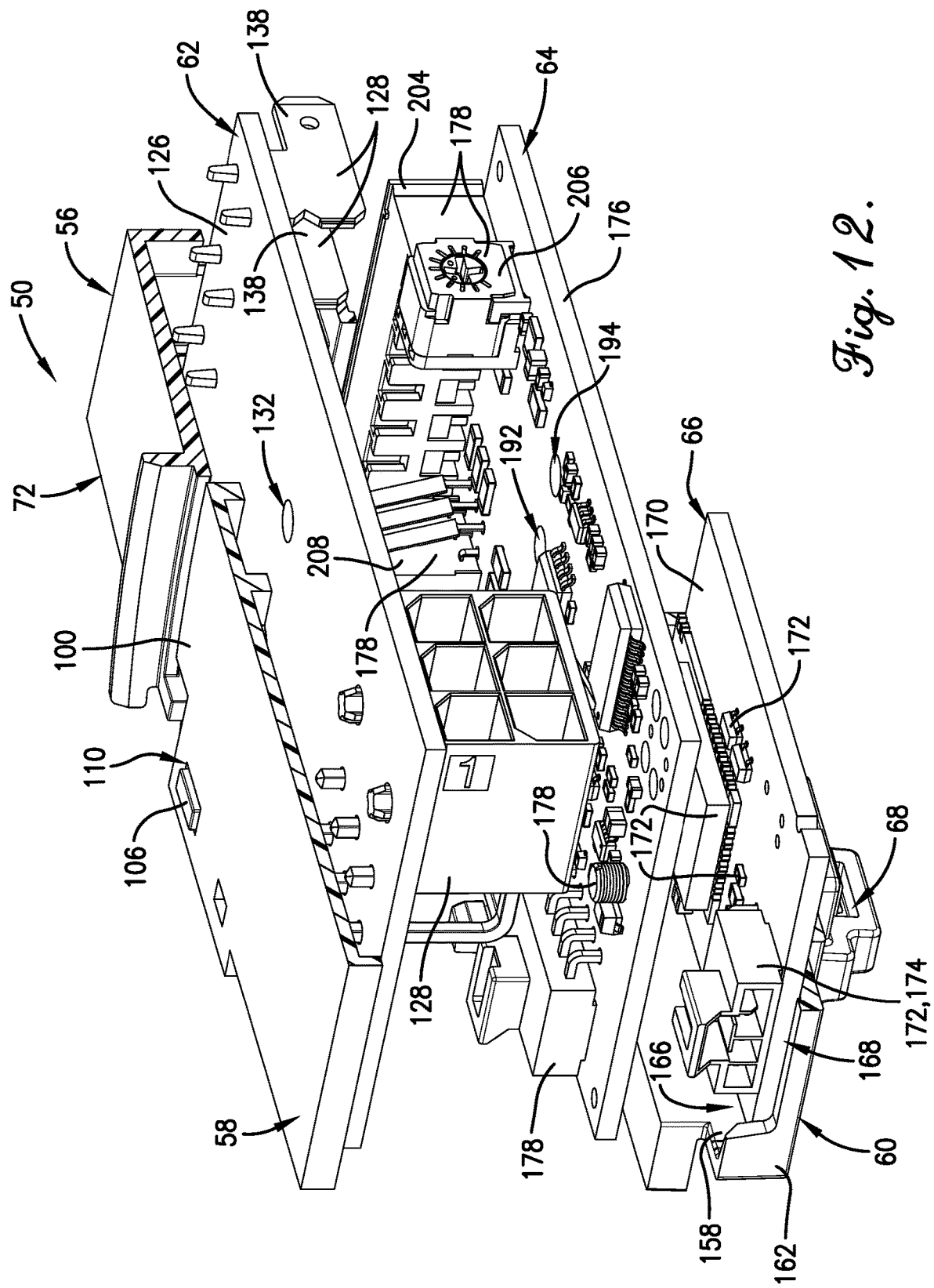
FIG. 12 is an alternative perspective view of the partially sectioned modular connector assembly of FIG. 11.
Figure 13:
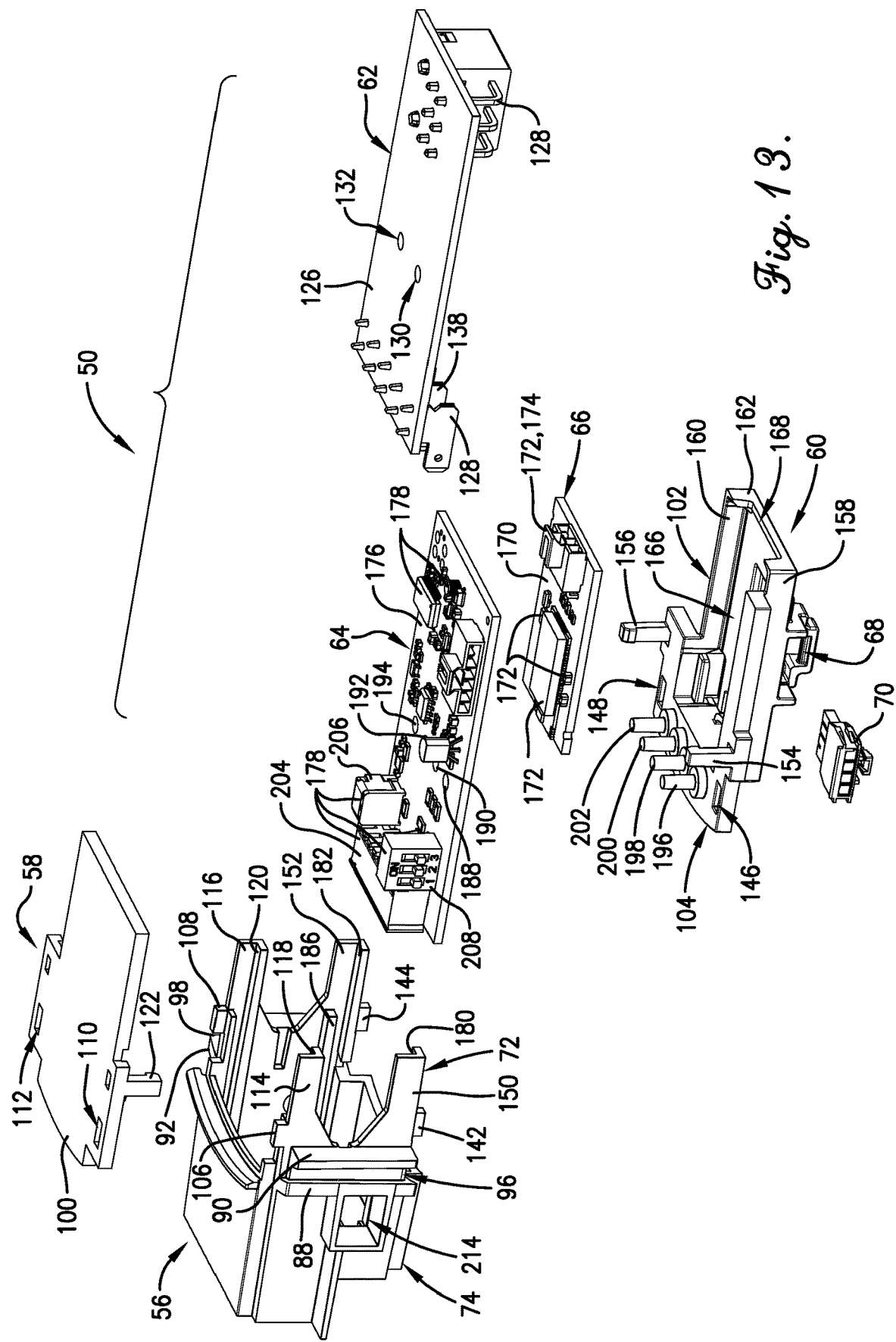
FIG. 13 is an exploded perspective view of the modular connector assembly of FIGS. 7-12.
Figure 14:
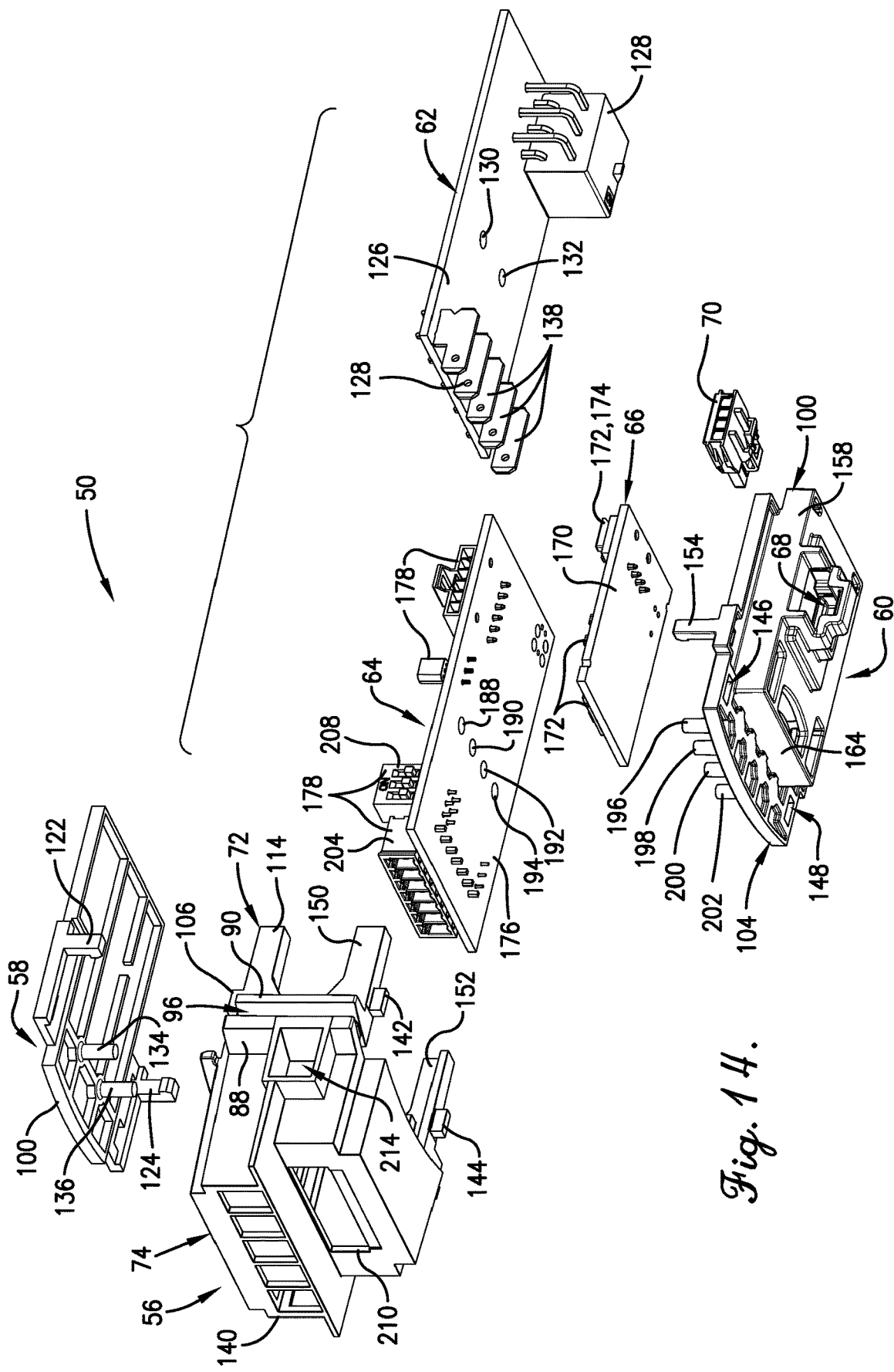
FIG. 14 is an alternative exploded perspective view of the modular connector assembly of FIG. 13.

With initial reference to FIGS. 1 and 2, an electric motor assembly 10 is provided. The motor assembly 10 is preferably for use in any one or more of a variety of machines or applications, including but not limited to residential or commercial ventilation systems, clothes dryers, ovens, heating units, ventilation units, air-conditioning units, fans, and refrigeration units. For instance, the motor assembly 10 in a preferred embodiment is configured to drive an exhaust fan in a hood in a commercial kitchen.

The motor assembly 10 broadly includes a motor 12, a controller 14, a motor housing 16, a controller housing 18, and a conduit box 20. The motor 12 includes a rotor 22 and a stator 24. The rotor 22 is rotatable about an axis. Inner rotor, outer rotor, and dual rotor motors all fall within the scope of the present invention.

The rotor 22 preferably includes a shaft 26 rotatable about the axis. The shaft 26 preferably includes a connection or drive end 28 that projects axially past the motor housing 16.

The stator 24 preferably includes a stator core and a plurality of coils wound about the stator core. However, other stator designs are permissible without departing from the scope of the present invention.

The motor housing 16 preferably includes a shell 30 and top and bottom endshields 32 and 34 spaced axially from one another by the shell 30. The shell 30 and the endshields 32 and 34 preferably cooperatively define a motor chamber 36 that at least substantially receives the stator 24 and the rotor 22.

In a preferred embodiment, the shell 30 extends generally circumferentially about the internal motor components. It is permissible according to some aspects of the present invention, however, for the shell to extend in such a manner as to provide one or more flat sides, in contrast to the preferred generally cylindrical form, or to be otherwise alternatively shaped. The shell 30 preferably extends generally continuously but defines a plurality of ventilation openings or slots 38 therethrough. Additional or alternative openings in accordance with specific application needs are permissible without departing from the scope of the present invention, however, as is the omission of any openings so as to form a fully enclosed motor chamber.

The controller housing 18 preferably defines a controller chamber 40 that substantially receives the controller 14. As will be discussed in greater detail below, however, certain portions of the controller 14 project outward of the controller chamber 40.

The controller housing 18 preferably includes a disc-like end wall 42 and a circumferentially extending sidewall (or, alternatively described, a cylindrical shell) 44 that extends axially between the end wall 42 and the bottom endshield 34 of the motor housing 16. The controller housing 18 may be fixed to the bottom endshield 34 by fasteners 46, as illustrated, or by other means. Most preferably, the sidewall 44 of the controller housing 18 and the shell 30 of the motor housing 16 present at least substantially equal outer diameters and are aligned with one another so as to define a generally cylindrical portion of an overall motor envelope. Size and shape disparities fall within the scope of some aspects of the present invention, however.

The controller 14 preferably controls at least one aspect of motor operation, such as speed, direction, torque, startup, stoppage, etc. The controller 14 preferably includes a main electronics board 48 and a modular connector assembly 50.

The main electronics board 48 is preferably a printed circuit board including a disc-like base 52 and a plurality of electronic components 54 projecting therefrom. The base 52 is preferably shaped and sized similarly to the end wall 42 of the controller housing 18 and is circumscribed by the sidewall 44, with the main electronics board 48 as a whole thereby being received in its entirety within the controller chamber 40. Alternative designs and placements fall within the scope of the present invention, however.

As will be discussed in detail below, in the illustrated embodiment, the modular connector assembly 50 includes a connector 56, a top plate 58, a bottom plate 60, a power board 62, a communication board 64, and a wireless technology enabled board 66 such as, for example, the wireless technology standard developed by Bluetooth® Special Interest Group. The bottom plate 60 defines a connector-receiving space or seat 68 for receiving a Bluetooth harness connector 70.

The power board 62, the communication board 64, and the Bluetooth® board 66 are each preferably daughter boards of the main electronics board 48. Furthermore, the power board 62, the communication board 64, and the Bluetooth® board 66 each preferably extend parallel to each other and are axially spaced apart. It is permissible according to some aspects of the present invention for more or fewer of such daughter boards to be provided, however, and for non-parallel arrangements to be used. In some embodiments, for instance, the Bluetooth® board might be omitted.

In a preferred embodiment, the connector 56 includes an inner connector portion 72 and an outer connector portion 74. As will be discussed in greater detail below, the inner connector portion 72 is disposed within the controller chamber 40. The outer connector portion 74 is disposed outside of the controller chamber 40 in the preferred embodiment, and is preferably received within the conduit box 20. In some embodiments, the conduit box may be omitted, with the outer connector portion therefore being exposed or provided with an alternative form of covering or protection.

Preferably, the sidewall 44 of the controller housing 18 defines a primary cutout 76. The cutout 76 is defined by first and second arcuately spaced apart, at least substantially axially extending side edges 78 and 80, and a bottom edge 82. The sidewall 44 includes a top lip 84 axially opposite the end wall 42. The bottom edge 82 is axially spaced from the top lip 84 so as to be disposed axially intermediately between the top lip 84 and the end wall 42. In the illustrated embodiment, the bottom edge 82 is bisected by an axially extending slot 86 that extends from the cutout 76 toward (but not all the way to) the end wall 42. The connector 56 preferably includes two pairs of generally arcuately extending walls 88, 90 and 90, 92 defining a pair of arcuately spaced apart grooves 96 and 98. The connector 56 is sized and shaped to slide axially into the cutout 76, with the side edges 78 and 80 being received in respective ones of the grooves 96 and 98. Thus, as noted above, the inner portion 72 of the connector 56 is disposed radially inward of the cylindrical shell or sidewall 44 (i.e., within the controller chamber 40), while the outer portion 74 of the connector 56 is disposed radially outside the cylindrical shell or sidewall 44 (i.e., outside the controller chamber 40).

It is further noted that, in the illustrated embodiment, the top plate 58 is received within the controller chamber 40 except at an outermost portion 100 thereof that is arcuately aligned with the grooves 96 and 98 (and, in turn, the sidewall 44). The bottom plate 60, on the other hand, is preferably received in its entirety within the controller chamber 40. More particularly, the bottom plate 60 preferably includes an inner portion 102 disposed within the controller chamber 40 and an outer portion 104 that is likewise disposed within the controller chamber 40.

The Bluetooth® board 66 is preferably fully received within the controller chamber 40. As will be discussed in greater detail below, the communication board 64 and the power board 62 each are received primarily within the controller chamber 40, but each extends in part radially outwardly thereof.

The connector 56 and the top and bottom plates 58 and 60 cooperatively support the power, communication, and Bluetooth® boards 62, 64, and 66. Furthermore, the connector 56 supports the top and bottom plates 58 and 60.

More particularly, the connector 56 includes a pair of axially upwardly extending upper posts 106 and 108. The top plate 58 includes a pair of post-receiving apertures 110 and 112 in which the posts 106 and 108 are received. The connector 56 also includes a pair of arcuately spaced apart upper brackets 114 and 116, each of which includes a corresponding shelf 118 or 112. The top plate 58 includes a pair of resiliently deflectable latches 122 and 124 that engage the corresponding ones of the brackets 114 and 116 to additionally secure the top plate 58 to the connector 56.

The power board 62 is preferably a high-voltage printed circuit board including a base 126 and a plurality of components 128 mounted to the base 126. The base 126 rests on the shelves 118 and 120 when the power board 62 is mounted on the connector 56. Furthermore, a pair of holes 130 and 132 are defined through the base 126. The top plate 58 includes a pair of axially downwardly projecting pegs 134 and 136 that are received in the holes 130 and 132 when the power board 62 is mounted on the connector 56.

Among other things, the components 128 of the power board 62 include a plurality of electrical contacts 138 that extend into a terminal 140 formed by the outer connector portion 74. Thus, the power board 62 is in part accessible from external to the motor assembly 10 (or, more specifically, from outside the shell or sidewall 44 of the controller housing 18).

The connector 56 preferably includes a pair of axially downwardly extending lower posts 142 and 144. The bottom plate 60 includes a pair of post-receiving apertures 146 and 148 in which the posts 142 and 144 are received. The connector 56 also includes a pair of arcuately spaced apart lower brackets 150 and 152. The bottom plate 60 includes a pair of resiliently deflectable latches 154 and 156 that engage the corresponding ones of the brackets 150 and 152 to additionally secure the bottom plate 60 to the connector 56. The bottom plate 60 further includes a pair of sidewalls 160 and 162 and inner and outer walls 164 and 166, respectively, defining a tray 168. A notch 170 is formed in the inner wall 164.

The Bluetooth® board 66 is preferably a printed circuit board including a base 170 and a plurality of components 172 mounted to the base 170. The base 170 is received within the tray 168 when the Bluetooth® board 66 is mounted on the bottom plate 60 (and to the connector 56 in a broad sense via attachment of the bottom plate 60 to the connector 56). The notch 168 is positioned to facilitate access to at least one of the components 172 and, most preferably, to a Bluetooth® harness connector 174 that is mounted to the base 170.

As noted previously, the bottom plate 60 also defines the connector-receiving space 68 for receiving the additional, independent Bluetooth® harness connector 70 that, unlike the just-described Bluetooth® harness connector 174, is not a component of the Bluetooth® board 66. More particularly, the connector-receiving space or seat 68 is preferably formed below the tray 168 and is sized and shaped to receive the Bluetooth® harness connector 70.

The Bluetooth® board 66 is preferably received in its entirety within the controller chamber 40, although alternative positioning falls within the scope of some aspects of the present invention.

In some embodiments of the present invention, due to specific customer requirements, the Bluetooth® board may be omitted. However, the connector-receiving space or seat 68 is provided regardless of whether or not a Bluetooth® board is used, enabling alternate Bluetooth® configurations to be utilized without changes being necessary to the modular connector assembly 50 in a broad sense.

The communication board 64 is preferably a low-voltage printed circuit board including a base 176 and a plurality of components 178 mounted to the base 176. The lower brackets 150 and 152 of the connector 56 each define a corresponding shelf 180 or 182 The base 176 rests on the shelves 180 and 182 when the communication board 64 is mounted on the connector 56.

A respective rail 184 or 186 also extends longitudinally along each of the lower brackets 150 and 152. The rails 184 and 186 engage or nearly engage an upper surface of the base 176, such that the communication board 64 is retained on each side between corresponding sets of the rails 184 and 186 and shelves 180 and 182.

Furthermore, a plurality of holes 188, 190, 192, and 194 are preferably defined through the base 176. The bottom plate 60 includes a plurality of upwardly projecting pegs 196, 198, 200, and 202 that correspond to the holes 188, 190, 192, and 194 and are received therein when the communication board 64 is mounted on the connector 56.

The components 178 of the communication board 64 preferably include at least a connection box 204, a potentiometer 206, and a switch 208. The connection box 204 preferably extends into a frame 210 defined by the outer connector portion 74, such that the communication board 64 is in part accessible from external to the motor assembly 10 (or, more specifically, from outside the shell or sidewall 44 of the controller housing 18).

The switch 208 is most preferably a dual in-line package (DIP) switch, although other switch types are permissible. In the illustrated embodiment, the switch 208 is a slide-style DIP switch, although other styles of DIP switch (e.g., rocker, rotary, etc.) might alternatively be used. The switch 208 preferably functions to allow a user to select a function to be adjusted by the potentiometer 206. For instance, the switch 208 might be configured to vary the functionality of the potentiometer 206 to (1) invert the $\theta_{max}$ signal, (2) change the motor speed or torque, (3) change the rotational direction of the motor, or (4) power down and stop the motor for a predefined period of time (e.g., a minute).

The modular connector assembly 50 is configured such that the potentiometer 206 and the switch 208 are both at least in part accessible from external to the motor assembly 10 (or, more specifically, from outside the shell or sidewall 44 of the controller housing 18). More particularly, the outer connector portion 74 defines a potentiometer access portal 212 that extends to and facilitates access to the potentiometer 206. The outer connector portion 74 also defines a switch access portal 214 that extends to and facilitates access to the switch 208.

In a preferred embodiment, as illustrated, the switch access portal 214 extends generally laterally (i.e., tangentially to the sidewall 44 of the controller housing 18) and presents a rectangular cross-sectional shape. The potentiometer access portal 212 also extends generally laterally (i.e., tangentially to the sidewall 44 of the controller housing 18) but presents a circular cross-sectional shape. The preferred cross-sectional shapes and sizes correspond to the shapes and sizes of the corresponding switch 208 and potentiometer 206. However, non-congruent cross-sectional profiles of the portals fall within the scope of some aspects of the present invention.

The motor assembly 10 described above, and particularly the modular connector assembly 50 thereof, provide numerous advantages. For instance, provision of an integrated controller 14 (i.e., including both the main electronics board 48 and the modular connector assembly 50) eliminates the need for a separate main control and user interface (UI) box. Furthermore, an additional lead assembly, as would be necessary to connect a separate UI box to the motor, is not needed. Such additional components are associated with increased expense, packaging and handling issues, and an increased motor envelope.

Furthermore, easy access to the switch 208 and potentiometer 206 without removal of the modular connector assembly 50 or any other key motor components facilitates efficient and effective control of the motor 12.

Still further, the present configuration allows any necessary leads to be routed in a variety of configurations to best suit the particular application. Leads might be routed along two (2) sides of the conduit box 20, for instance, or on the front or back thereof.

Although the above description presents features of preferred embodiments of the present invention, other preferred embodiments may also be created in keeping with the principles of the invention. Furthermore, these other preferred embodiments may in some instances be realized through a combination of features compatible for use together despite having been presented independently as part of separate embodiments in the above description.

The preferred forms of the invention described above are to be used as illustration only, and should not be utilized in a limiting sense in interpreting the scope of the present invention. Obvious modifications to the exemplary embodiments, as hereinabove set forth, could be readily made by those skilled in the art without departing from the spirit of the present invention.

The inventors hereby state their intent to rely on the Doctrine of Equivalents to determine and assess the reasonably fair scope of the present invention as pertains to any apparatus not materially departing from but outside the literal scope of the invention as set forth in the following claims.

What is claimed is:

1. A motor assembly comprising:
a motor;
a controller controlling at least one aspect of operation of said motor; and
a control housing defining a control chamber,
said controller in part received within said control chamber,
said controller including a main electronics board and a modular connector assembly,
said modular connector assembly including a secondary electronics board and a connector at least in part supporting said secondary electronics board,
said connector including an inner connector portion and an outer connector portion,
said connector extending through said control housing such that said inner connector portion is disposed inside said control chamber and said outer connector portion is disposed outside said control chamber,
said outer connector portion defining a first access portal facilitating access to a first component of said secondary electronics board,
said modular connector assembly including another secondary electronics board,
said another secondary electronics board extending parallel to said secondary electronics board.

2. The motor assembly of claim 1,
said control housing including a cylindrical shell,
said outer connector portion being disposed radially outward of said shell.

3. The motor assembly of claim 2,
said secondary electronics board projecting radially outwardly beyond said shell,
said first component being disposed radially outward of said shell.

4. The motor assembly of claim 1,
said secondary electronics board comprising a communication board,
said first component comprising a potentiometer.

5. The motor assembly of claim 1,
said secondary electronics board comprising a communication board,
said first component comprising a switch.

6. The motor assembly of claim 5,
said outer connector portion defining a second access portal facilitating access to a second component of said secondary electronics board.

7. The motor assembly of claim 6,
said second component being a switch.

8. The motor assembly of claim 1,
said modular connector assembly defining a connector-receiving space.

9. The motor assembly of claim 8,
said modular connector assembly including a wireless harness connector received in said connector-receiving space.

10. The motor assembly of claim 1,
said modular connector assembly further including a power board,
said connector defining at least one power board connection opening.

11. A motor assembly comprising:
a motor;
a controller controlling at least one aspect of operation of said motor; and
a control housing defining a control chamber,
said controller in part received within said control chamber,
said controller including a main electronics board and a modular connector assembly,
said modular connector assembly including a secondary electronics board and a connector at least in part supporting said secondary electronics board,
said connector including an inner connector portion and an outer connector portion,
said connector extending through said control housing such that said inner connector portion is disposed inside said control chamber and said outer connector portion is disposed outside said control chamber,
said outer connector portion defining a first access portal facilitating access to a first component of said secondary electronics board,
said modular connector assembly including another secondary electronics board,
said another secondary electronics board comprising a wireless board,
said connector at least in part supporting said wireless board.

12. The motor assembly of claim 11,
said control housing including a cylindrical shell,
said outer connector portion being disposed radially outward of said shell.

13. The motor assembly of claim 12,
said secondary electronics board projecting radially outwardly beyond said shell,
said first component being disposed radially outward of said shell.

14. The motor assembly of claim 11,
said modular connector assembly defining a connector-receiving space,
said modular connector assembly including a wireless harness connector received in said connector-receiving space.

15. A motor assembly comprising:
a motor;
a controller controlling at least one aspect of operation of said motor; and
a control housing defining a control chamber,
said controller in part received within said control chamber, said controller including a main electronics board and a modular connector assembly, said modular connector assembly including a secondary electronics board and a connector at least in part supporting said secondary electronics board, said connector including an inner connector portion and an outer connector portion, said connector extending through said control housing such that said inner connector portion is disposed inside said control chamber and said outer connector portion is disposed outside said control chamber, said outer connector portion defining a first access portal facilitating access to a first component of said secondary electronics board, said modular connector assembly further including a top plate and a bottom plate fixed to said connector, one of said top plate and said bottom plate at least in part supporting said secondary electronics board.

16. The motor assembly of claim 15,
each of said top plate and said bottom plate extending laterally from said connector.

17. The motor assembly of claim 15,
each of said top plate and said bottom plate including a resiliently deflectable latch component for securing said respective one of said top plate and said bottom plate to said connector.

18. The motor assembly of claim 15,
said one of said top plate and said bottom plate defining a connector-receiving space configured to receive a wireless harness connector.

19. The motor assembly of claim 18,
said modular connector assembly further including a power board at least in part supported by said top plate,
said secondary board comprising a communication board,
said bottom plate defining said connector-receiving space,
said modular connector assembly further comprising a wireless harness connector received in said connector-receiving space.

20. The motor assembly of claim 18,
said modular connector assembly further including a power board at least in part supported by said top plate,
said secondary board comprising a communication board,
said bottom plate defining said connector-receiving space,
said modular connector assembly further comprising a wireless board at least in part supported by said bottom plate.

\* \* \* \* \*